United States Patent
Wills et al.

[11] Patent Number: 5,451,550
[45] Date of Patent: Sep. 19, 1995

[54] METHOD OF LASER CVD SEAL A DIE EDGE

[75] Inventors: Kendall S. Wills, Houston; Paul A. Rodriguez, Lewisville, both of Tex.

[73] Assignee: Texas Instruments Incorporated, Dallas, Tex.

[21] Appl. No.: 658,118

[22] Filed: Feb. 20, 1991

[51] Int. Cl.⁶ .......................................... H01L 21/316
[52] U.S. Cl. .................... 437/235; 437/213; 437/215
[58] Field of Search ............... 437/209, 211, 213, 215, 437/221, 224, 235; 357/72, 74; 257/751, 782, 783

[56] References Cited

U.S. PATENT DOCUMENTS

| | | | |
|---|---|---|---|
| 4,477,828 | 10/1984 | Scherer | 357/74 |
| 4,633,573 | 1/1987 | Scherer | 437/211 |
| 4,782,787 | 11/1988 | Roche | 118/728 |

FOREIGN PATENT DOCUMENTS

| | | | |
|---|---|---|---|
| 0342681 | 11/1989 | European Pat. Off. | 437/211 |
| 0093227 | 7/1980 | Japan | 437/211 |
| 0148824 | 7/1986 | Japan | 437/211 |
| 0120053 | 6/1987 | Japan | |

*Primary Examiner*—R. Bruce Breneman
*Attorney, Agent, or Firm*—Ronald O. Neerings; James C. Kesterson; Richard L. Donaldson

[57] ABSTRACT

A semiconductor die is enveloped by an ambient gas that will react to the presence of a particular wave length of light. A laser beam is focused on the edge of the die to deposit a dielectric coating. The laser beam or the die is rotated until the dielectric coating covers the entire die edge. The dielectric coating acts as a seal that is impervious to water and other contamination that can reduce the die reliability. The dielectric coating also electrically insulates the die from its surroundings.

19 Claims, 4 Drawing Sheets

METHOD OF LASER CVD SEAL A DIE EDGE

FIELD OF THE INVENTION

This invention relates to sealing a semiconductor die edge, and more particularly to laser CVD sealing a semiconductor die edge.

BACKGROUND OF THE INVENTION

A semiconductor device is subject to reliability failure if contamination from the outside world enters the device. One likely entrance location for contamination in a semiconductor die is the edge of the die. Semiconductor manufacturers typically fabricate a diffused line or region around the edge of the die to lessen the possibility of this form of contamination. The diffused line or region may also be biased to ensure entrapment of contamination in the diffused region.

A protective overcoat may also be placed over the die to prevent contamination from entering the die through the top surface. The protective overcoat extends past the die edge to help the diffused region capture the contamination. But even these precautions will not prevent contamination from entering the active region of the die through irregularities in the diffused line or region.

Irregularities are introduced into the die when the slice containing the die is scribed and broken. The scribe operation is a rough mechanical procedure that can damage the protective structures used to prevent contamination from entering the die from the die edge. The damage generally manifests itself in the form of cracks and nicks in the protective structures. Normal final testing may fail to detect cracks which, unfortunately, show up after the die has been in the field for some time.

Incidental field failures may also occur when bond wires droop during assembly. The bond wire may get close or electrically contact the die edge altering the signal to the die by shorting the die edge.

What is needed is a method to prevent contamination from entering a die through cracks in the edge of the die. What is also needed is a method to prevent bond wires or bond tracks, which run across the die edge, from shorting to the die or one another due to conduction through the die.

SUMMARY OF THE INVENTION

In accordance with one embodiment of the invention, a die is enveloped by an ambient gas that will react to the presence of a particular wave length of light. A laser beam is focused on the edge of the die. The gas undergoes a photo chemical or pyrolytic reaction on the die edge to deposit a dielectric coating. The laser beam or the die is rotated until the dielectric coating covers the entire die edge. The dielectric coating acts as a seal that is impervious to water and other contamination that can reduce the die reliability. The dielectric coating also electrically insulates the die from its surroundings.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE INVENTION

Figure 1:
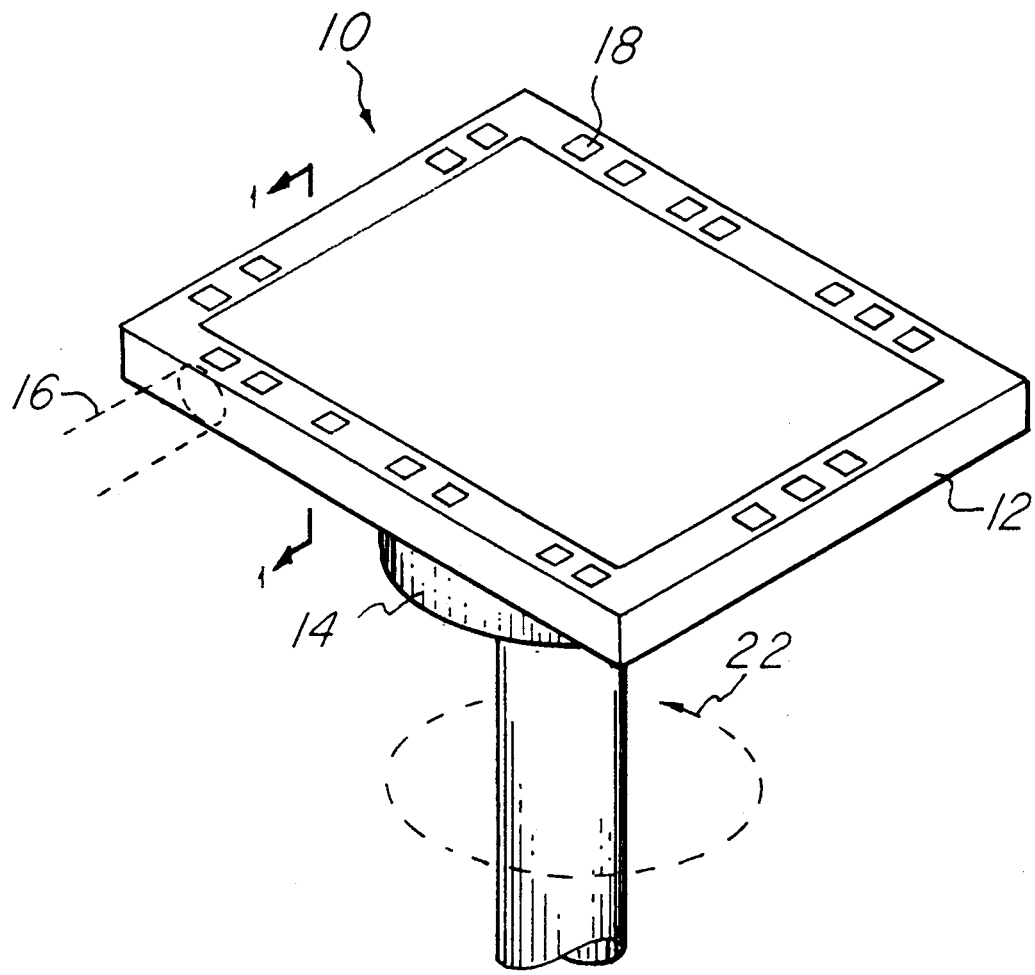
FIG. 1 is a perspective view of one embodiment of the invention.

FIG. 1 discloses a die 10 having an edge 12. The size and shape of die 10 and edge 12 are merely descriptive for the purposes of this application. In practice, dies and die edges will exist in various sizes and shapes. In FIG. 1, die 10 is placed on a support surface 14 within an ambient gas or liquid atmosphere. Examples of acceptable ambient gasses when annealing with a dopant include $PCL_3$, $BCL_3$ and $B[CH_3]_3$. For a nitride, typical gasses include $NH_4$ and $SICL_2$. For an oxide, typical gasses include $O_2$ and $SICL_2$. If annealing is desired without a dopant, an atmosphere of oxygen or a vacuum is used in lieu of ambient gasses.

Figure 2:
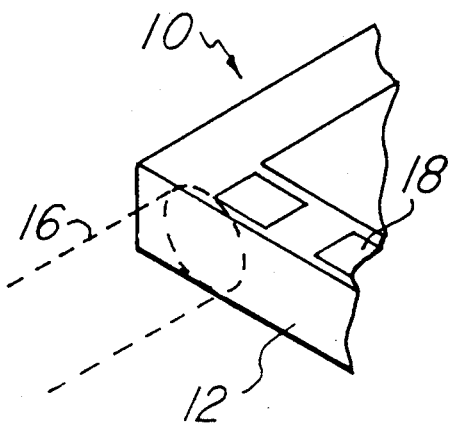
FIG. 2 is a sectional view, enlarged, of the device of FIG. 1, taken along the line 1—1.

Next, a laser beam 16 is focused on the edge 12 of die 10. Laser beam 16 should overlap the edge 12 of the die 10 but not hit any of the bond pads 18, as shown in FIG. 2. Lasers used as sources of heat for pyrolytic deposition of silicon and other materials such as A1, W, Ti and A102 are ideal for the purpose. In practice, any laser capable of annealing the die can be used. Other sources of localized heating, such as electron beam, focused Ion beam mill or highly focused incoherent light, can be substituted for the laser. Other lasers which can deposit materials by causing a chemical reaction through the absorption of energy into energy bands below the disassociation energy of the molecule can also be used.

Figure 3:
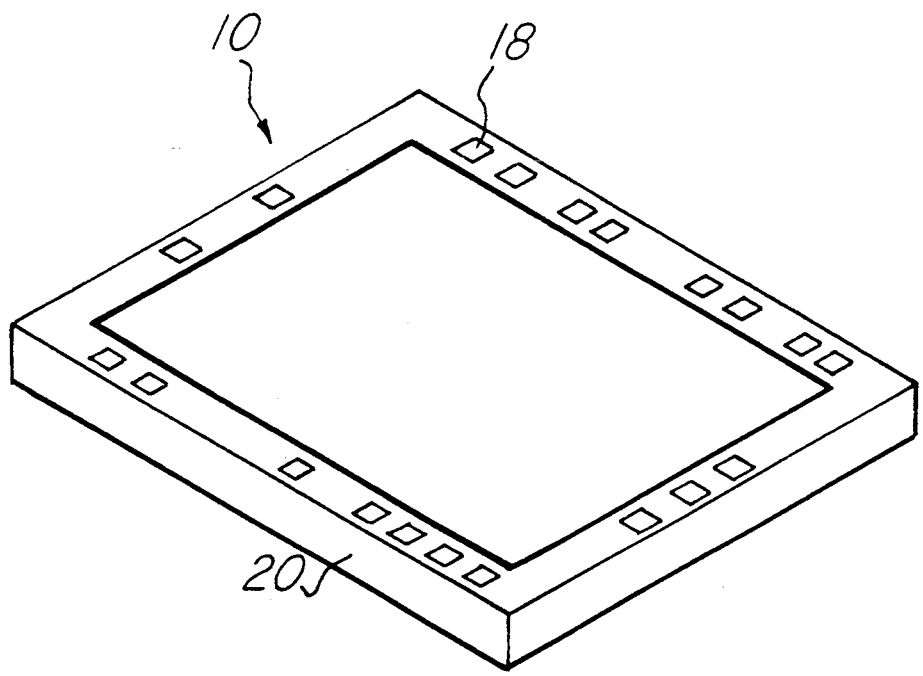
FIG. 3 is a perspective view of a die having a dielectric coating over the edge of the die, according to the invention.
Figure 4:
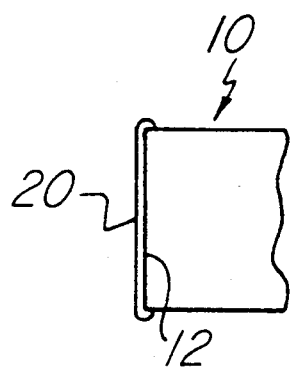
FIG. 4 is a side sectional view, enlarged, of the device of FIG. 3, taken along the line 2—2.

The ambient gas reacts to the presence of the laser beam 16 which is incident upon the die edge 12. The ambient gas undergoes a photo chemical reaction on the die edge 12 to deposit a dielectric coating 20. Dielectric coating 20 may have a dopant in it as described above. Support surface 14 or laser beam 16 is rotated in the direction of arrow 22 until a dielectric coating 20 is deposited completely around die 10 along die edge 12. The entire surface of die edge 12 must be covered by dielectric coating 20 for best results. Image processing is used to track the deposition. The dielectric coating acts as a seal that may be impervious to water and other contamination that reduce die reliability. The dielectric coating also electrically insulates the die from its surroundings. FIGS. 3 and 4 show a die 10 having its entire die edge 12 covered by dielectric coating 20.

Figure 5:
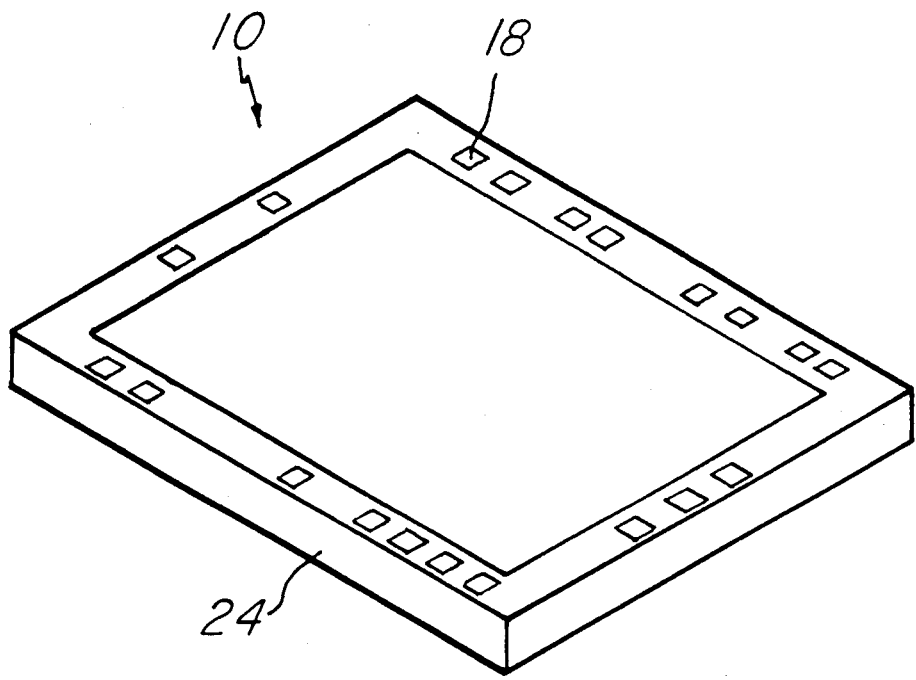
FIG. 5 is a perspective view of a die having a conductive coating over the edge of the die, according to another embodiment of the invention.
Figure 6:
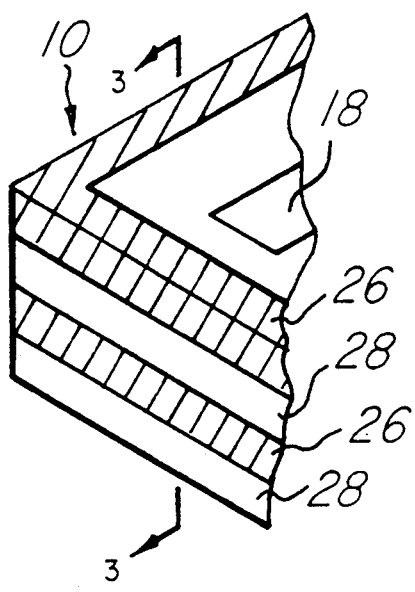
FIG. 6 is a sectional view of a die according to another embodiment of the invention.
Figure 7:
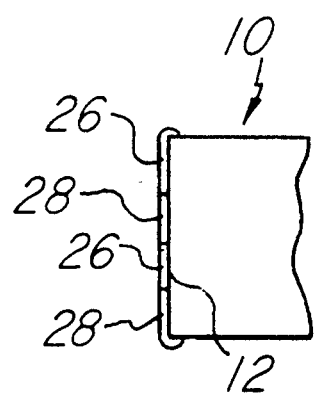
FIG. 7 is a side sectional view, enlarged, of the device of FIG. 6, taken along the line 3—3.
Figure 8:
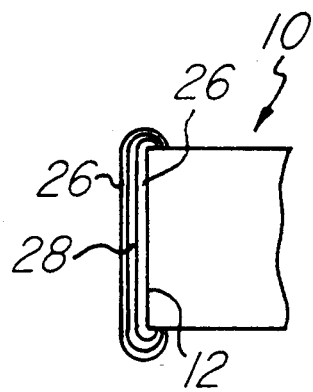
FIG. 8 is a side sectional view of a die according to yet another embodiment of the invention.

The application of a dielectric coating to the edge of a die effectively seals both cracked and uncracked die edges. The dielectric coating may be a nitride, an oxide or a combination of the two. In situations where the shorting of bond wires to the die edge is not a problem, a conductive die edge of silicon or other conductive materials may be substituted for the dielectric coating. FIG. 5 shows a die having its entire die edge 12 covered by a conductive die edge 24. It is also possible to have a protective coating of alternate dielectric layers 26 and conductive layers 28, as shown in FIGS. 6, 7, and 8.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of sealing a die edge, comprising the steps of:
    placing a die in a controlled atmosphere; and
    focusing a coherent light on an edge of said die to deposit a dielectric coating on said edge of said die.

2. The method of claim 1 wherein said controlled atmosphere includes at least one ambient gas.

3. The method of claim 1 wherein said controlled atmosphere is a vacuum.

4. The method of claim 2 wherein said dielectric coating includes a dopant.

5. The method of claim 1 wherein said coherent light is a laser beam.

6. The method of claim 5 wherein said laser beam is generated by a laser used as a source of heat for pyrolytic deposition of silicon, A1, W, Ti or AlO$_2$.

7. The method of claim 5 wherein said laser beam is generated by a laser which can deposit materials by causing a chemical reaction through the absorption of energy into energy bands below the disassociation energy of the molecule.

8. A method of sealing a die edge, comprising the steps of:
    placing a die in a controlled atmosphere; and
    focusing a coherent light on an edge of said die to deposit a protective coating on said edge of said die.

9. The method of claim 8 wherein said protective coating is a conductive material.

10. The method of claim 9 wherein said protective coating is silicon.

11. The method of claim 1 wherein said protective coating is alternating layers of conductive and dielectric materials.

12. The method of claim 1 including the step of rotating said die or said coherent light until the dielectric coating covers the entire die edge.

13. The method of claim 8 including the step of rotating said die or said coherent light until the protective coating covers the entire die edge.

14. The method of claim 1 wherein said controlled atmosphere is a liquid.

15. The method of claim 1 wherein said coherent light is an electron beam.

16. The method of claim 1 wherein said coherent light is a focused Ion beam mill.

17. A method of sealing a die edge, comprising the step of focusing a coherent light on an edge of a die to anneal said edge of said die.

18. The method of claim 14 including the step of placing the die into a controlled atmosphere prior to focusing the coherent light on an edge of the die to anneal the edge of said die.

19. The method of claim 17 including the step of rotating said die or said coherent light until the entire die edge is annealed.

* * * * *